United States Patent
Nakazawa

(10) Patent No.: US 11,114,496 B2
(45) Date of Patent: Sep. 7, 2021

(54) ACTIVE MATRIX SUBSTRATE, X-RAY IMAGING PANEL WITH THE SAME, AND METHOD FOR PRODUCING THE SAME

(71) Applicant: Sharp Kabushiki Kaisha, Sakai (JP)

(72) Inventor: Makoto Nakazawa, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 30 days.

(21) Appl. No.: 16/775,020

(22) Filed: Jan. 28, 2020

(65) Prior Publication Data
US 2020/0243596 A1   Jul. 30, 2020

Related U.S. Application Data

(60) Provisional application No. 62/798,644, filed on Jan. 30, 2019.

(51) Int. Cl.
*H01L 27/146* (2006.01)
*H01L 27/148* (2006.01)

(52) U.S. Cl.
CPC .. *H01L 27/14663* (2013.01); *H01L 27/14612* (2013.01); *H01L 27/14812* (2013.01)

(58) Field of Classification Search
CPC ......... H01L 27/14663; H01L 27/14612; H01L 27/14812; H01L 27/14692; H01L 51/4293–442
See application file for complete search history.

(56) References Cited

U.S. PATENT DOCUMENTS

| | | | | |
|---|---|---|---|---|
| 4,633,287 A * | 12/1986 | Yamazaki | ......... | H01L 27/14681 136/255 |
| 4,931,661 A * | 6/1990 | Fukaya | ............ | H01L 27/14665 250/208.1 |
| 5,028,973 A * | 7/1991 | Bajor | .................. | H01L 29/7375 257/593 |
| 5,311,047 A * | 5/1994 | Chang | ................. | H01L 31/1105 257/187 |
| 7,332,751 B2 * | 2/2008 | Iguchi | ................ | H01L 27/1446 257/184 |
| 8,044,445 B2 * | 10/2011 | Hayashi | ............ | H01L 27/14609 257/292 |
| 8,497,562 B2 * | 7/2013 | Ishida | ............... | H01L 27/14658 257/458 |
| 9,853,084 B2 * | 12/2017 | Caris | ................. | H01L 27/14689 |
| 10,141,357 B2 * | 11/2018 | Miyamoto | ........ | H01L 29/78633 |

(Continued)

FOREIGN PATENT DOCUMENTS

JP  2009-260305 A   11/2009
JP  2011-114310 A   6/2011

*Primary Examiner* — Jarrett J Stark
(74) *Attorney, Agent, or Firm* — ScienBiziP, P.C.

(57) ABSTRACT

An active matrix substrate includes: a photoelectric conversion element 15; an electrode 14b provided with a first opening h1 and disposed on one surface of the photoelectric conversion element 15; an organic insulating film 106 provided with a second opening h2 and covering the photoelectric conversion element 15 and the electrode 14b; and a conductive film 16 for supplying a bias voltage to the electrode 14b. The first opening h1 and the second opening h2 overlap each other when viewed in plan view. The conductive film 16 is provided inside the first opening h1 and the second opening h2 so as to be in contact with the electrode 14b.

10 Claims, 14 Drawing Sheets

(56) References Cited

U.S. PATENT DOCUMENTS

| | | | |
|---|---|---|---|
| 10,811,449 B2* | 10/2020 | Misaki | H01L 27/14618 |
| 10,811,457 B2* | 10/2020 | Na | H01L 27/14616 |
| 10,991,750 B2* | 4/2021 | Nakazawa | H01L 27/14663 |
| 11,011,665 B2* | 5/2021 | Lee | H01L 27/14603 |
| 2005/0263709 A1* | 12/2005 | Watanabe | H01L 27/14676 250/370.11 |
| 2009/0026509 A1* | 1/2009 | Hayashi | H01L 27/14612 257/292 |
| 2009/0236496 A1 | 9/2009 | Tanada et al. | |
| 2011/0127593 A1* | 6/2011 | Hayashi | H01L 27/14663 257/292 |

* cited by examiner

ACTIVE MATRIX SUBSTRATE, X-RAY IMAGING PANEL WITH THE SAME, AND METHOD FOR PRODUCING THE SAME

BACKGROUND OF THE INVENTION

1. Field of the Invention

The invention disclosed herein relates to an active matrix substrate, an X-ray imaging panel with the same, and a method for producing the active matrix substrate.

2. Description of Related Art

Conventionally, an active matrix substrate having pixels each provided with a photoelectric conversion element connected to a switching element has been used in X-ray imaging devices. For example, JP 2011-114310 A discloses such an X-ray imaging device. The X-ray imaging device disclosed in JP 2011-114310 A includes an array substrate in which light-receiving pixel regions are arrayed. Each light-receiving pixel region is provided with a photodiode that includes a lower electrode, a photoelectric conversion layer, and an upper electrode, and a passivation film is provided so as to cover surfaces of the photodiode, upper electrode, and lower electrode. A contact hole that passes through the passivation film is formed above the upper electrode, and a bias line connected to the upper electrode through the contact hole is provided on the passivation film.

By the way, during the production process of an active matrix substrate, components contained in an upper electrode, an organic insulating film provided on the upper electrode, etc. may be deposited and accumulate on the upper electrode. When a bias line is formed on the upper electrode with a deposit being present on the upper electrode, contact failure may occur between the bias line and the upper electrode. When contact failure occurs, a bias voltage is not applied to the upper electrode, and imaging cannot be performed properly. This causes a reduction in yield of an array substrate.

SUMMARY OF THE INVENTION

An active matrix substrate developed in light of the above-described problem is an active matrix substrate including: a photoelectric conversion element; an electrode provided with a first opening, the electrode being disposed on one surface of the photoelectric conversion element; an organic insulating film provided with a second opening, the organic insulating film covering the photoelectric conversion element and the electrode; and a conductive film for supplying a bias voltage to the electrode. The first opening and the second opening overlap each other when viewed in plan view. The conductive film is provided inside the first opening and the second opening so as to be in contact with the electrode.

According to the present invention, it is possible to suppress a reduction in yield of an active matrix substrate.

BRIEF DESCRIPTION OF THE DRAWINGS

In FIG. 8A, a state where the opening of the fourth insulating film before being subjected to an ashing process has been formed.

DETAILED DESCRIPTION OF THE INVENTION

Figure 1:
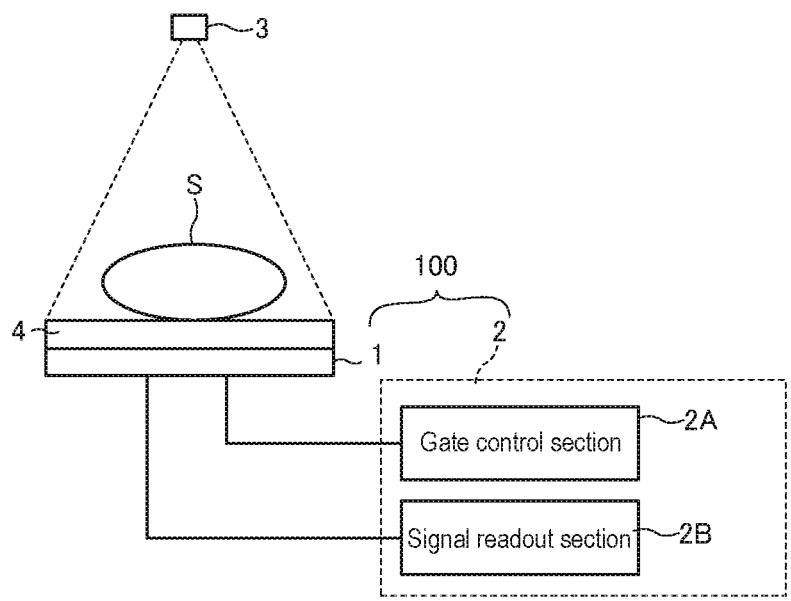
FIG. 1 is a schematic view showing an X-ray imaging device in a first embodiment.

Embodiments of the present invention will be described in detail below with reference to the drawings. Components that are identical or equivalent to each other in the drawings are given the same reference numerals, and descriptions thereof are not repeated.

First Embodiment (Configuration)

FIG. 1 is a schematic view showing an X-ray imaging device that uses an active matrix substrate according to the present embodiment. An X-ray imaging device 100 includes an active matrix substrate 1 and a control unit 2. The control unit 2 includes a gate control section 2A and a signal readout section 2B. A subject S is irradiated with X-rays emitted from an X-ray source 3. X-rays that have passed through the subject S are converted to fluorescence (referred to as "scintillation light" hereinafter) by a scintillator 4 disposed over the active matrix substrate 1. The X-ray imaging device 100 acquires an X-ray image by capturing the scintillation light using the active matrix substrate 1 and the control unit 2.

Figure 2:
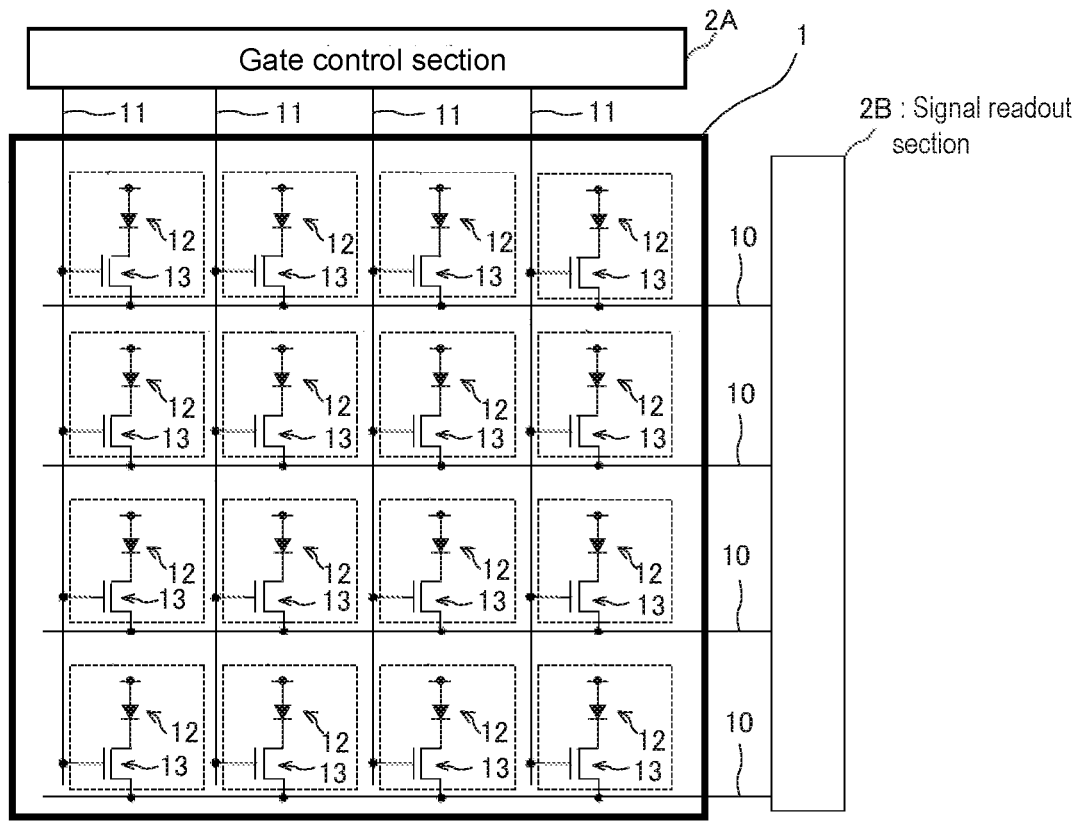
FIG. 2 is a schematic view showing a schematic configuration of the active matrix substrate shown in FIG. 1.

FIG. 2 is a schematic view showing a schematic configuration of the active matrix substrate 1. As shown in FIG. 2, a plurality of source lines 10 and a plurality of gate lines 11 that cross the plurality of source lines 10 are formed on the active matrix substrate 1. Each gate line 11 is connected to the gate control section 2A, and each source line 10 is connected to the signal readout section 2B.

The active matrix substrate 1 has a plurality of pixels, which are bounded by the source lines 10 and the gate lines 11, as light-receiving regions for receiving scintillation light converted from X-rays that have passed through the subject S. Each pixel is provided with a TFT 13 and a photodiode 12.

The gate lines 11 on the active matrix substrate 1 are sequentially switched to a selected state by the gate control section 2A, and TFTs 13 connected to the gate line 11 that is in the selected state are turned ON. In each pixel, when the TFT 13 is turned ON, a signal corresponding to a charge obtained through conversion of the scintillation light by the photodiode 12 is output to the signal readout section 2B through the source line 10.

Figure 3:
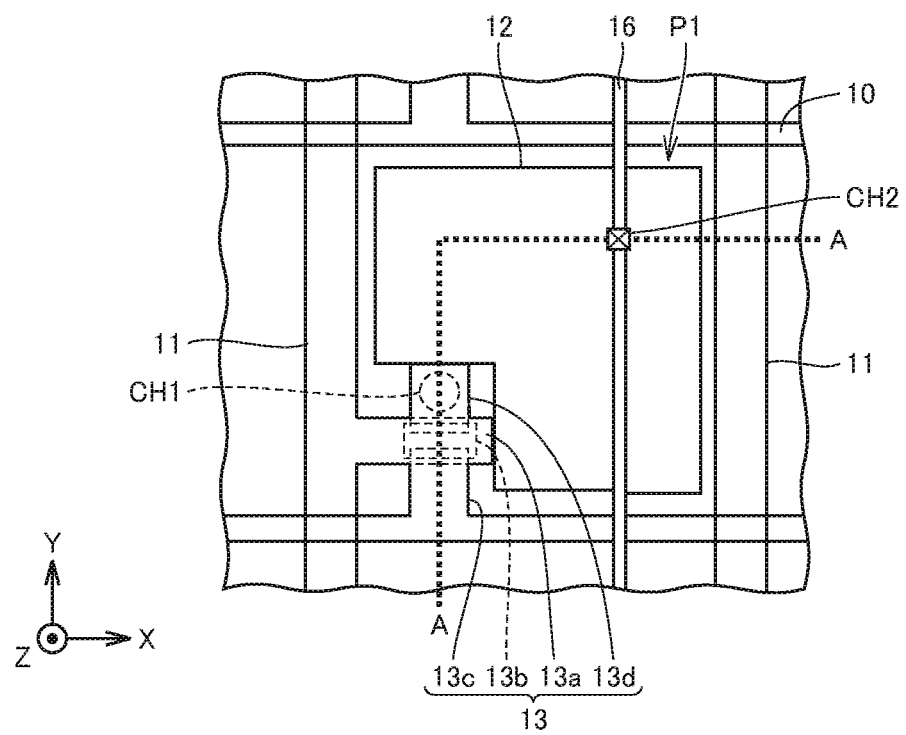
FIG. 3 is an enlarged plan view showing one of pixels on the active matrix substrate shown in FIG. 2.

FIG. 3 is an enlarged plan view showing one of the pixels on the active matrix substrate 1 shown in FIG. 2. As shown in FIG. 3, a pixel P1 is provided with a photodiode 12 and a TFT 13.

The TFT 13 includes a gate electrode 13a connected to a gate line 11, a semiconductor active layer 13b, a source electrode 13c connected to a source line 10, and a drain electrode 13d. The drain electrode 13d and the photodiode 12 are connected to each other through a contact hole CH1.

In this example, in the pixel P1, a bias line 16 is disposed substantially in parallel to the gate lines 11 and such that it overlaps the photodiode 12 when viewed in plan view, and the photodiode 12 and the bias line 16 are connected to each other through a contact hole CH2. The bias line 16 supplies a bias voltage to the photodiode 12.

Figure 4A:
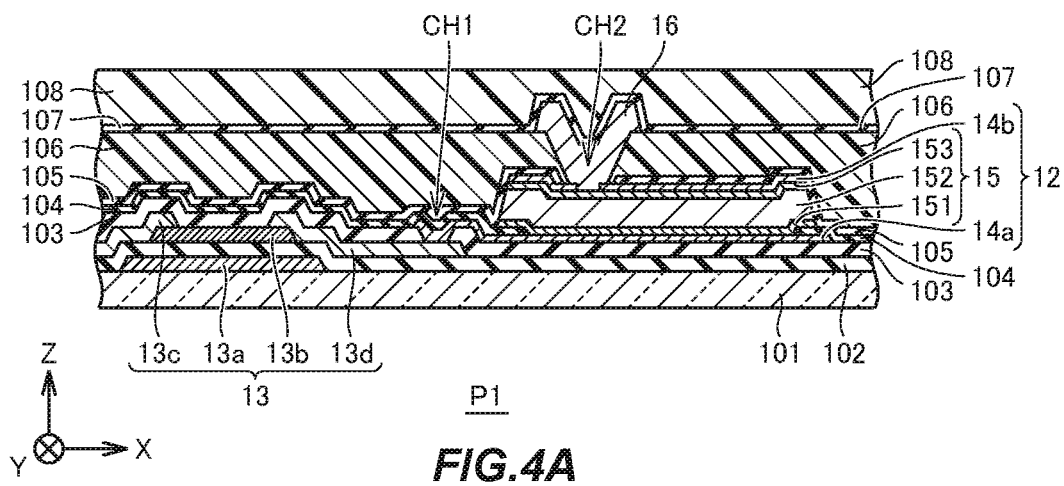
FIG. 4A is a schematic cross-sectional view of the pixel taken along line A-A in FIG. 3A.
Figure 4B:
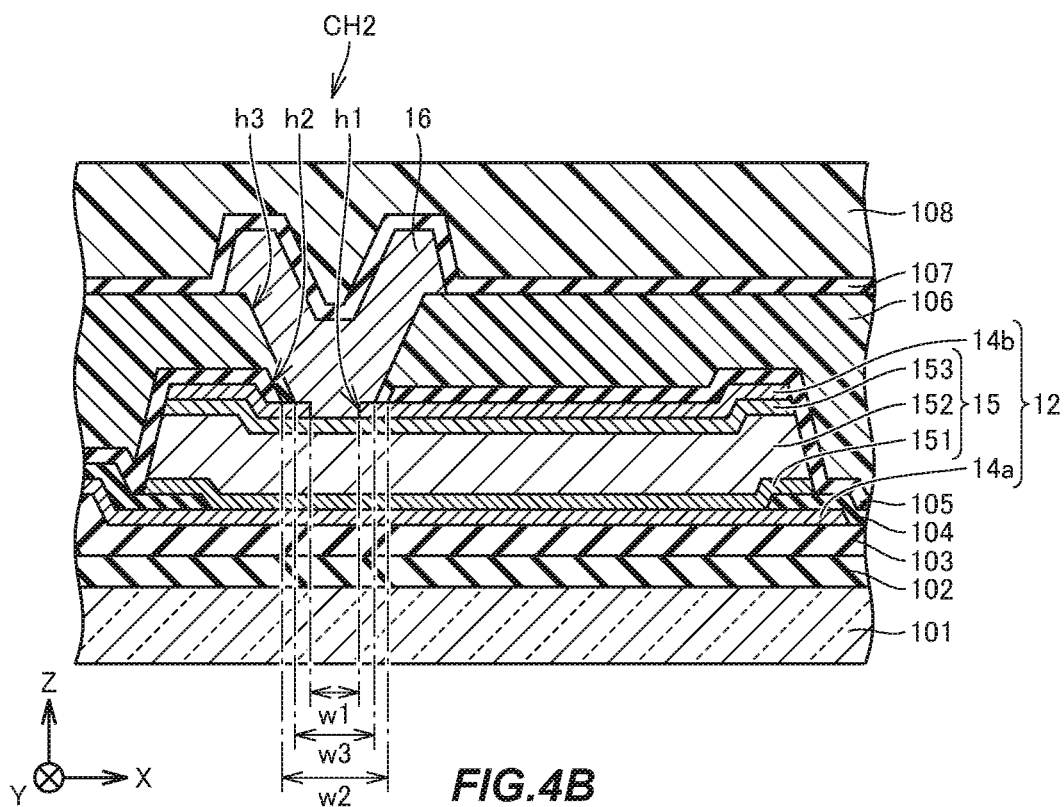
FIG. 4B is an enlarged view of a portion including a region where a photodiode and a bias line are provided in FIG. 4A.

Next, the configuration of the pixel P1 will be described specifically with reference to FIGS. 4A and 4B. FIG. 4A is a schematic cross-sectional view of the pixel P1 taken along line A-A in FIG. 3. FIG. 4B is an enlarged view of a portion including a region where the photodiode 12 is provided in FIG. 4A.

As shown in FIG. 4A, the gate electrode 13a and a gate insulating film 102 are formed on a substrate 101. The substrate 101 is a substrate having insulating properties, such as, for example, a glass substrate.

In this example, the gate electrode 13a is formed integrally with the gate line 11 (see FIG. 3). In the present embodiment, the gate electrode 13a and the gate line 11 have a laminate structure in which a lower layer made of tantalum nitride (TaN) and an upper layer made of tungsten (W) are laminated. It is preferable that, for example, the thickness of the tantalum nitride (TaN) is approximately between 30 nm to 100 nm inclusive, and the thickness of the tungsten (W) is approximately between 300 nm to 500 nm inclusive. The structures of the gate electrode 13a and the gate line 11 are not limited to the two-layer structure, and they may be composed of a single layer or three or more layers. The material and the thickness of the gate electrode 13a and the gate line 11 are described as illustrative examples, and they are not limited to those described above.

The gate electrode 13a and the gate line 11 (see FIG. 3) are covered with the gate insulating film 102. In the present embodiment, the gate insulating film 102 has a laminate structure in which an inorganic insulating film made of silicon nitride ($SiN_x$) as a lower layer and an inorganic insulating film made of silicon oxide ($SiO_x$) as an upper layer are laminated. It is preferable that the thickness of the inorganic insulating film made of silicon nitride ($SiN_x$) is approximately 325 nm and the thickness of the inorganic insulating film made of silicon oxide ($SiO_x$) is approximately 50 nm. The structure of the gate insulating film 102 is not limited to the two-layer structure, and the gate insulating film 102 may be composed of a single layer or three or more layers. The material and the thickness of the gate insulating film 102 are not limited to those described above.

The semiconductor active layer 13b, and the source electrode 13c and the drain electrode 13d, which are connected to the semiconductor active layer 13b, are provided on the gate electrode 13a with the gate insulating film 102 interposed therebetween.

The semiconductor active layer 13b is formed in contact with the gate insulating film 102. The semiconductor active layer 13b is made of an oxide semiconductor. The oxide semiconductor, for example, an amorphous oxide semiconductor containing indium (In), gallium (Ga), and zinc (Zn) at a predetermined ratio, may be used. In this case, it is preferable that the thickness of the semiconductor active layer 13b is approximately 100 nm, for example. It is to be noted that the material and the thickness of the semiconductor active layer 13b are not limited to those described above.

The source electrode 13c and the drain electrode 13d are disposed on the gate insulating film 102 so as to be in contact with portions of the semiconductor active layer 13b. In this example, the source electrode 13c is formed integrally with the source line 10 (see FIG. 3). The source electrode 13c and the drain electrode 13d each have a laminate structure in which three metal films made of titanium (Ti), aluminum (Al), and titanium (Ti), respectively, are laminated in this order from the lowermost layer. It is preferable that the thicknesses of these three layers are approximately 50 nm, approximately 300 nm, and approximately 50 nm in this order from the lowermost layer. The structure of each of the source electrode 13c and the drain electrode 13d is not limited to the three-layer structure, and they may be composed of a single layer or two or more layers. The material and the thickness of each of the source electrode 13c and the drain electrode 13d are not limited to those described above.

A first insulating film 103 is provided on the gate insulating film 102 so as to overlap the source electrode 13c and the drain electrode 13d. The first insulating film 103 has a contact hole CH1 that passes through the first insulating film 103 at a position on the drain electrode 13d. In this example, the first insulating film 103 is an inorganic insulating film containing silicon oxide ($SiO_2$). It is preferable that the thickness of the first insulating film 103 is approximately 500 nm, for example. The structure of the first insulating film 103 is not limited to the single-layer structure, and may be a laminate structure in which an inorganic insulating film made of silicon oxide and an inorganic insulating film made of silicon nitride are laminated, for example.

On the first insulating film 103, a cathode electrode (referred to as "lower electrode" hereinafter) 14a of the photodiode 12 and second insulating films 104 are provided. The lower electrode 14a is connected to the drain electrode 13d through the contact hole CH1. In the present embodiment, the lower electrode 14a has a laminate structure in which three metal films made of titanium (Ti), aluminum (Al), and titanium (Ti), respectively, are laminated in this order from the lowermost layer. It is preferable that the thicknesses of these three metal films are, for example, approximately 50 nm, approximately 300 nm, and approximately 50 nm in this order from the lowermost layer. The structure of the lower electrode 14a is not limited to the three-layer structure, and the lower electrode 14a may be composed of a single layer or two or more layers. The material and the thickness of the lower electrode 14a are not limited to those described above.

On the first insulating film 103, the second insulating films 104 are provided such that they are spaced apart from each other on the lower electrode 14a. In the present embodiment, the second insulating films 104 are inorganic insulating films made of silicon oxide ($SiO_2$). The thickness of the second insulating films 104 is approximately 400 nm in this example. It is preferable that the thickness of the second insulating films 104 is approximately between 300 nm to 500 nm inclusive. It is to be noted that the material and the thickness of the second insulating films 104 are not limited to those described above.

A photoelectric conversion layer 15 is provided on the second insulating films 104 and the lower electrode 14a. The photoelectric conversion layer 15 is obtained by laminating an n-type amorphous semiconductor layer 151, an intrinsic amorphous semiconductor layer 152, and a p-type amorphous semiconductor layer 153 in this order.

The n-type amorphous semiconductor layer 151 is made of amorphous silicon doped with an n-type impurity (e.g., phosphorus). The n-type amorphous semiconductor layer 151 is in contact with the lower electrode 14a.

The intrinsic amorphous semiconductor layer 152 is made of intrinsic amorphous silicon. The intrinsic amorphous semiconductor layer 152 is formed in contact with the n-type amorphous semiconductor layer 151.

The p-type amorphous semiconductor layer 153 is made of amorphous silicon doped with a p-type impurity (e.g., boron). The p-type amorphous semiconductor layer 153 is formed in contact with the intrinsic amorphous semiconductor layer 152.

In this example, it is preferable that the thickness of the n-type amorphous semiconductor layer 151 is approximately between 10 nm to 100 nm inclusive and the thickness of the intrinsic amorphous semiconductor layer 152 is approximately between 200 nm to 2000 nm inclusive. It is preferable that the thickness of the p-type amorphous semiconductor layer 153 is approximately between 10 nm to 50 nm inclusive. It is to be noted that the dopants and the thicknesses of the n-type amorphous semiconductor layer 151, the intrinsic amorphous semiconductor layer 152, and the p-type amorphous semiconductor layer 153 are not limited to those described above.

On the p-type amorphous semiconductor layer 153, an anode electrode (referred to as "upper electrode" hereinafter) 14b of the photodiode 12 is provided. As shown in FIG. 4B, the upper electrode 14b has an opening h1 at a position on the photoelectric conversion layer 15. In the present embodiment, the upper electrode 14b is, for example, a transparent conductive film made of indium tin oxide (ITO) or indium Zn oxide (IZO). It is preferable that the thickness of the upper electrode 14b is approximately 100 nm, for example. It is to be noted that the material and the thickness of the upper electrode 14b are not limited to those described above.

On the second insulating films 104 and the photodiode 12, a third insulating film 105 is provided. As shown in FIG. 4B, an opening h2 that passes through the third insulating film 105 is formed such that the opening h2 overlaps the opening h1 when viewed in plan view. The width W2 of the opening h2 in the X-axis direction is larger than the width W1 of the opening h1.

In the present embodiment, the third insulating film 105 is an inorganic insulating film made of silicon nitride (SiN). It is preferable that the thickness of the third insulating film 105 is approximately between 300 nm to 500 nm inclusive, for example. It is to be noted that the material and the thickness of the third insulating film 105 are not limited to those described above.

On the third insulating film 105, a fourth insulating film 106 is provided. As shown in FIG. 4B, an opening h3 that passes through the fourth insulating film 106 is formed such that the opening h3 overlaps the openings h1 and h2 when viewed in plan view. The width W3 of the opening h3 in the X-axis direction is smaller than the width W2 of the opening h2 and larger than the width W1 of the opening h1. That is, in the present embodiment, the lengths W1 to W3 of the openings h1 to h3 in the X-axis direction satisfy the relationship of W1<W3<W2. A contact hole CH2 is formed by the openings h1 to h3. Although a cross-sectional view of a region in which the openings h1 to h3 are provided, taken along the extending direction of the bias line 16 is not shown, the widths of the openings h1 to h3 in the extending direction of the bias line 16 are substantially the same as the widths of the openings h1 to h3 in the X-axis direction, respectively. That is, the openings h1 to h3 each have an approximately square shape.

The fourth insulating film 106 is made of an organic transparent resin such as an acrylic resin or a siloxane resin, for example. It is preferable that the thickness of the fourth insulating film 106 is approximately 2.5 μm, for example. It is to be noted that the material and the thickness of the fourth insulating film 106 are not limited to those described above.

On the fourth insulating film 106, the bias line 16 is provided. The bias line 16 is in contact with the upper electrode 14b and the p-type amorphous semiconductor layer 153 of the photoelectric conversion layer 15 through the contact hole CH2. The bias line 16 is connected to the control unit 2 (see FIG. 1) and applies a bias voltage input from the control unit 2 to the photodiode 12.

The bias line 16 has a laminate structure in which three metal films made of titanium (Ti), aluminum (Al), and titanium (Ti), respectively, are laminated, for example. It is preferable that the thicknesses of these metal films are approximately 50 nm, approximately 300 nm, and approximately 50 nm in this order from the lowermost layer. The structure of the bias line 16 is not limited thereto, and the bias line 16 may be composed of a single layer or two or more layers. The material of the bias line 16 is not limited to those described above.

A fifth insulating film 107 is provided so as to cover the fourth insulating film 106 and the bias line 16. The fifth insulating film 107 is an inorganic insulating film made of silicon nitride ($SiN_x$), for example. The thickness of the fifth insulating film 107 is approximately 300 nm in this example. It is preferable that the thickness of the fifth insulating film 107 is approximately between 200 nm to 500 nm inclusive. It is to be noted that the material and the thickness of the fifth insulating film 107 are not limited to those described above.

A sixth insulating film 108 is provided so as to cover the fifth insulating film 107. The sixth insulating film 108 is made of an organic transparent resin such as an acrylic resin or a siloxane resin, for example. It is preferable that the thickness of the sixth insulating film 108 is approximately 3.0 μm, for example. It is to be noted that the material and the thickness of the sixth insulating film 108 are not limited to those described above.

Next, a method for producing the active matrix substrate 1 in the present embodiment will be described with reference to FIGS. 5A to 5F. FIGS. 5A to 5F are cross-sectional views for illustrating steps of producing the active matrix substrate 1. These cross-sectional views show a region in which the photodiode 12 of the pixel P1 is formed in the respective production steps.

Although not shown in the drawings, first, the TFT 13 (see FIGS. 4A and 4B, etc.), the gate insulating film 102, and the first insulating film 103 are formed on the substrate 101 using a known method, and then, the photodiode 12 is formed on the first insulating film 103.

Figure 5A:
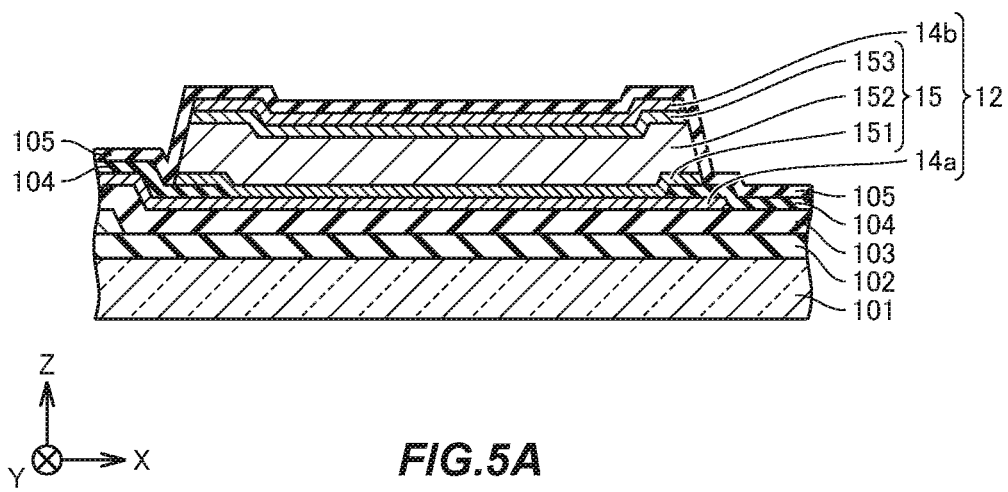
FIG. 5A is a cross-sectional view illustrating a step of producing an active matrix substrate, and shows a state after a photodiode and a third insulating film on the photodiode have been formed.
Figure 5B:
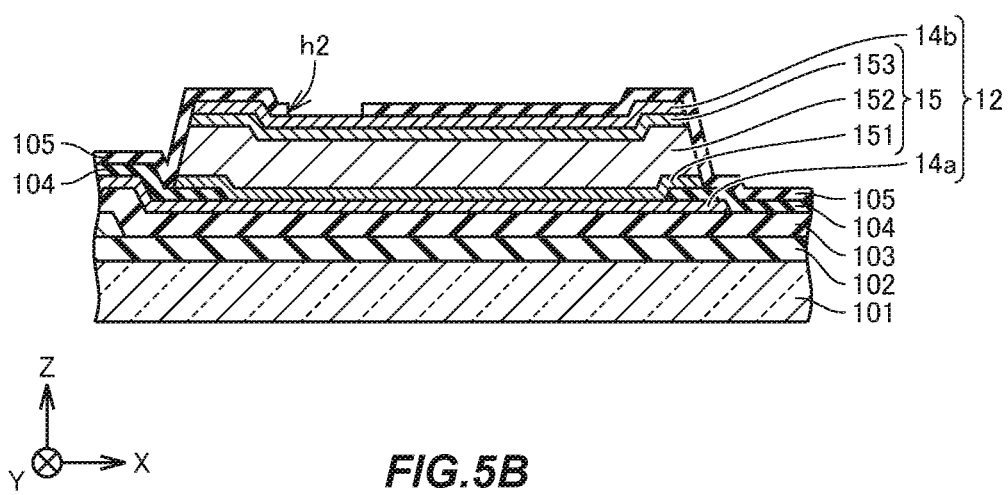
FIG. 5B is a cross-sectional view illustrating a step of forming an opening in the third insulating film shown in FIG. 5A.
Figure 5C:
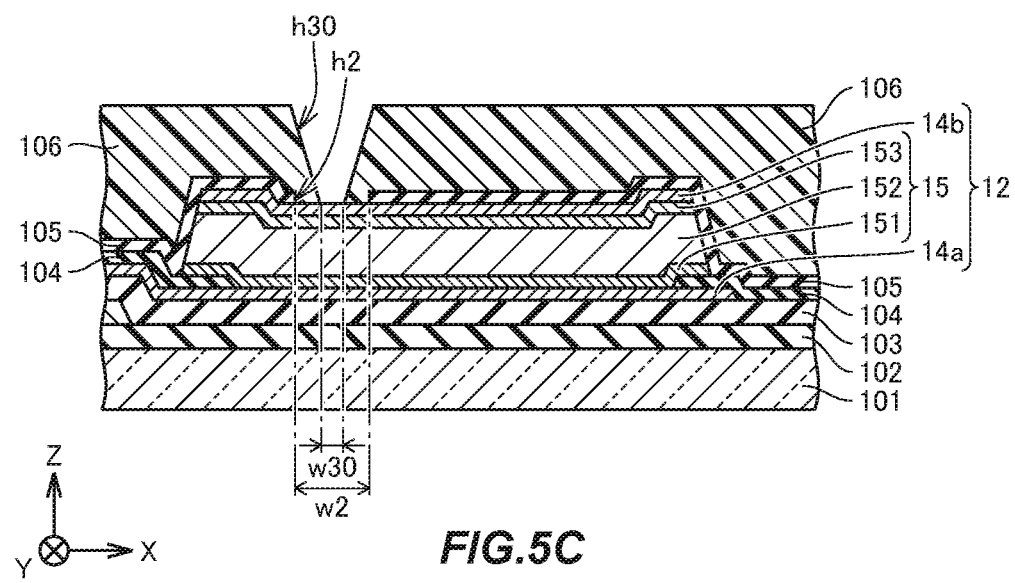
FIG. 5C is a cross-sectional view illustrating a step of forming a fourth insulating film on the third insulating film shown in FIG. 5B and forming an opening of the fourth insulating film.

Thereafter, as shown in FIG. 5A, the third insulating film 105 made of silicon nitride (SiN) is formed so as to cover the photodiode 12 through chemical vapor deposition (CVD), for example.

Subsequently, the third insulating film 105 is patterned by performing photolithography and dry etching. As a result, the opening h2 of the third insulating film 105 is formed at a position on the upper electrode 14b (see FIG. 5B).

Next, the fourth insulating film 106 made of an acrylic resin is formed so as to cover the third insulating film 105. Thereafter, through exposure and development of the fourth insulating film 106, the opening h30 that passes through the fourth insulating film 106 is formed inside the opening h2 of the third insulating film 105 (see FIG. 5C). The opening h30 has a reverse tapered shape with the opening width W30 in the X-axis direction on the upper electrode 14b side being smaller than the opening width on the side opposite to the upper electrode 14b side.

Figure 5D:
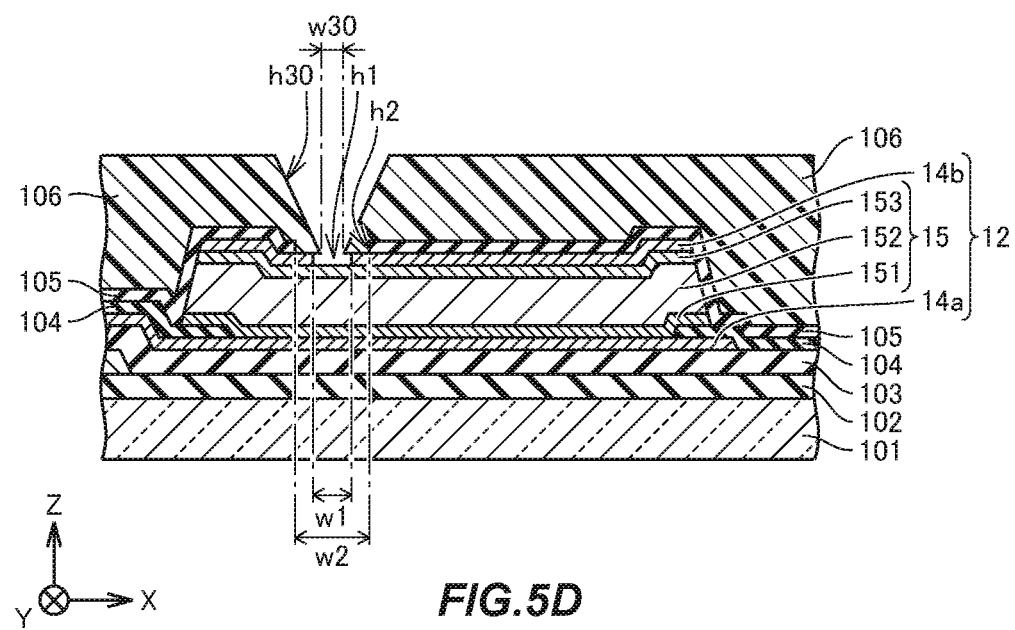
FIG. 5D is a cross-sectional view illustrating a step of forming an opening of an upper electrode using the fourth insulating film shown in FIG. 5C as a mask.

After the opening h30 has been formed, a portion of the upper electrode 14b below the opening h30 of the fourth insulating film 106 is subjected to etching using the fourth insulating film 106 as a mask (see FIG. 5D). When the upper electrode 14b is made of ITO, the upper electrode 14b is subjected to wet etching using oxalic acid as an etchant. As a result, the portion of the upper electrode 14b overlapping the opening h30 of the fourth insulating film 106 is removed by etching, whereby the opening h1 that passes through the upper electrode 14b is formed. Since the upper electrode 14b is isotropically etched using the fourth insulating film 106 as a mask, the width W1 of the opening h1 of the upper electrode 14b in the X-axis direction is larger than the width W30 of the opening h30 of the fourth insulating film 106. As a result, end portions of the fourth insulating film 106 in the opening h30 protrude farther than end portions of the upper electrode 14b in the opening h1.

Figure 5E:
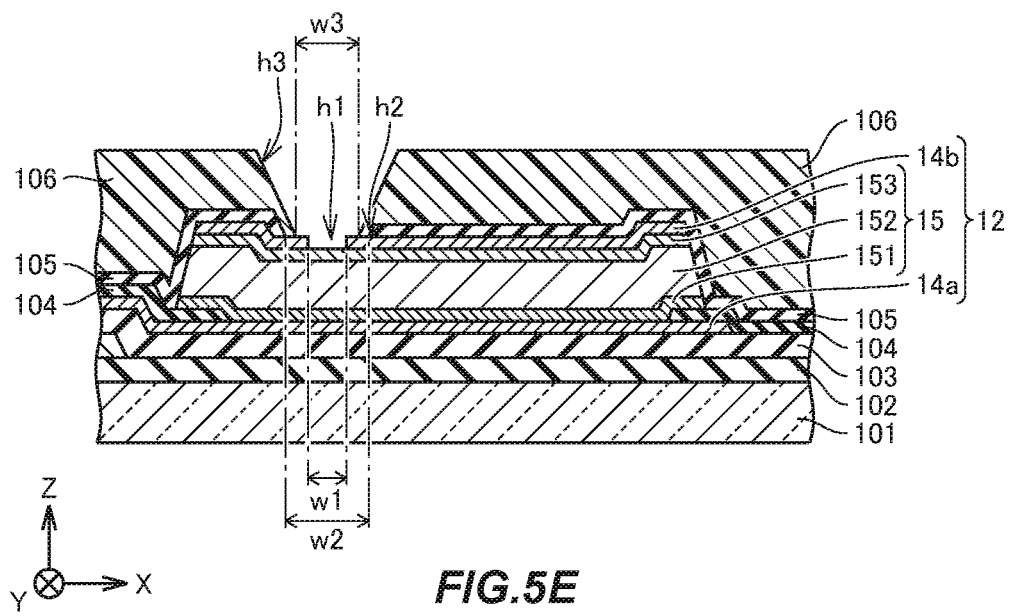
FIG. 5E is a cross-sectional view illustrating a step of expanding the opening of the fourth insulating film through an ashing process of the fourth insulating film shown in FIG. 5D.
Figure 5F:
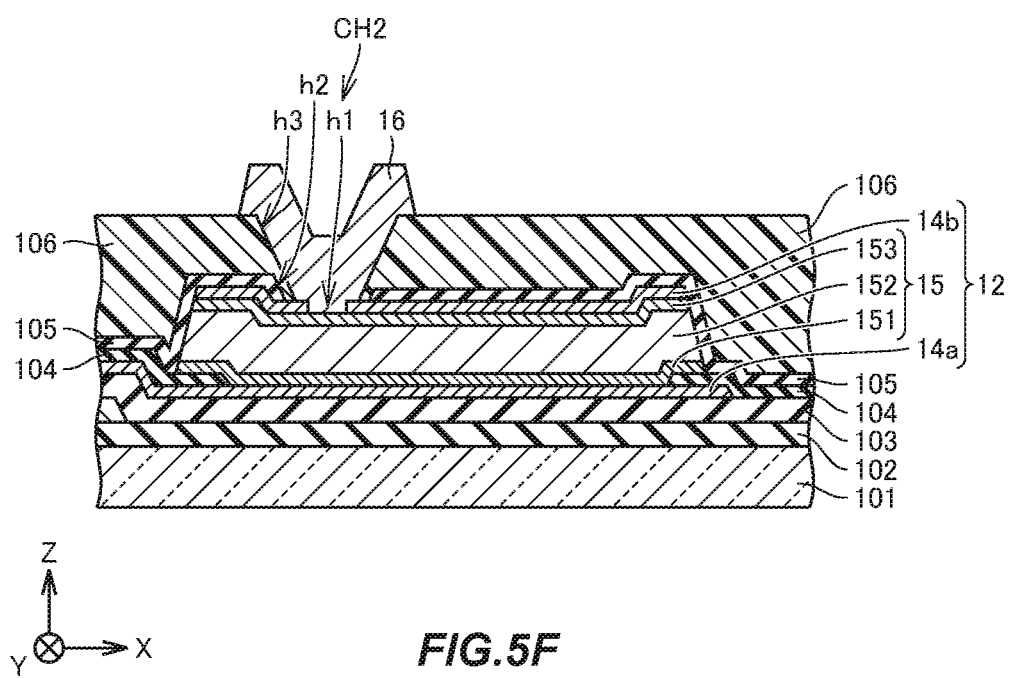
FIG. 5F is a cross-sectional view illustrating a step of forming a bias line on the fourth insulating film shown in FIG. 5E.

Subsequently, the fourth insulating film 106 is subjected to a plasma ashing process (see FIG. 5E). As a result, the opening h30 of the fourth insulating film 106 is expanded to form the opening h3. The width W3 of the opening h3 in the X-axis direction on the upper electrode 14b side is larger than the width W30 prior to the ashing process. As a result, the widths W1, W2, and W3 of the openings h1 to h3 in the X-axis direction satisfy the relationship of W1<W3<W2. Since only oxygen is used as plasma in the plasma ashing process, the upper electrode 14b and the p-type amorphous semiconductor layer 153 of the photodiode 12 are not etched.

Then, the metal films made of titanium (Ti), aluminum (Al), and titanium (Ti), respectively, for forming the bias line 16 are formed sequentially so as to cover the fourth insulating film 106 through sputtering, for example. Thereafter, these three metal films are patterned by performing photolithography and dry etching (see FIG. 5F). As a result, the bias line 16 is formed on the fourth insulating film 106 so as to cover the opening h3 and the opening h1, whereby the bias line 16 is connected to the upper electrode 14b and the p-type amorphous semiconductor layer 153.

After the bias line 16 has been formed, the fifth insulating film 107 (see FIG. 4A etc.) made of silicon nitride ($SiN_x$) is formed so as to cover the bias line 16 through, e.g., CVD (this step is not shown). Then, the sixth insulating film 108 (see FIG. 4A etc.) made of, e.g., an acrylic resin is formed so as to cover the fifth insulating film 107 (this step is not shown). In the above-described manner, the active matrix substrate 1 on which the pixel P1 shown in FIG. 4A is formed is produced.

As described above, in the present embodiment, the opening h1 passing through the upper electrode 14b is formed, and the bias line 16 is connected to the p-type amorphous semiconductor layer 153 and the upper electrode 14b through the opening h1. With this configuration, contact failure between the bias line 16 and the upper electrode 14b is less likely to occur. The reason for this will be described specifically below.

Through analysis by the inventors of the present invention, it has been revealed that contact failure between the bias line 16 and the upper electrode 14b may be caused owing to the presence of a deposit containing a component such as Sb (antimony), In (indium), or Si (silicon) between the bias line 16 and the upper electrode 14b. Such a deposit tends to be formed in the vicinity of the opening provided in the fourth insulating film 106 made of an acrylic resin in order to connect the bias line 16 to the upper electrode 14b. Specifically, in the configuration of the above-described embodiment, after the step of exposing and developing the fourth insulating film 106 to form the opening h30, deposits are formed on the portion of the upper electrode 14b overlapping the opening h30 when In (indium) contained in the upper electrode 14b and Sb (antimony) contained in the fourth insulating film 106 react with each other or cause electric corrosion.

In the above-described embodiment, after the opening h3 of the fourth insulating film 106 has been formed, the opening h1 is formed in the portion of the upper electrode 14b overlapping the opening h3 when viewed in plan view.

If the opening h1 is not provided, the deposits formed on the upper electrode 14b cause contact failure between the bias line 16 to be formed thereafter and the upper electrode 14b. In contrast, in the present embodiment, even if deposits are formed after the opening h3 of the fourth insulating film 106 has been formed, the deposits are removed as a result of forming the opening h1. Accordingly, contact failure between the bias line 16 and the upper electrode 14b is less likely to occur.

(Operations of X-Ray Imaging Device 100)

Operations of the X-ray imaging device 100 shown in FIG. 1 will now be described. First, X-rays are emitted from an X-ray source 3. At this time, the control unit 2 applies a predetermined voltage (bias voltage) to the bias line 16 (see FIG. 3 etc.). The X-rays emitted from the X-ray source 3 pass through the subject S to be incident on the scintillator 4. The X-rays incident on the scintillator 4 are converted to fluorescence (scintillation light), and the scintillation light is then incident on the active matrix substrate 1. When the scintillation light is incident on the photodiodes 12 provided in the respective pixels on the active matrix substrate 1, the photodiodes 12 convert the scintillation light to charges corresponding to the amounts of the scintillation light. Signals corresponding to the charges obtained through the conversion by the photodiodes 12 are read out by the signal readout section 2B (see FIG. 2 etc.) through the source lines 10 when the TFTs 13 (see FIG. 3 etc.) are in an ON state in response to a gate voltage (positive voltage) output from the gate control section 2A through the gate lines 11. Then, the control section 2 generates an X-ray image corresponding to the read-out signals.

Second Embodiment

In the above-described first embodiment, the bias line 16 is disposed on the photoelectric conversion layer 15. Accordingly, it is preferable that the bias line 16 has a narrower width from the viewpoint of securing the light receiving area in the pixel P1. In the first embodiment, after the opening h1 of the upper electrode 14b has been formed, the opening h30 of the fourth insulating film 106 is expanded through an ashing process. However, the narrower the width of the bias line 16, the more difficult it becomes to control the position and the size of the opening h3 according to the width of the bias line 16 through the ashing process. As a result, it becomes difficult to reliably establish contact between the bias line 16 and the upper electrode 14b. In particular, when the contact hole CH2 for bringing the bias line 16 into contact with the upper electrode 14b has a stack structure composed of the plurality of openings h1 to h3 as in the first embodiment, the openings h1 to h3 have to be formed properly such that the contact between the bias line 16 and the upper electrode 14b is established reliably. The present embodiment describes a configuration with which the contact between the bias line 16 and the upper electrode 14b can be established more reliably.

Figure 6A:
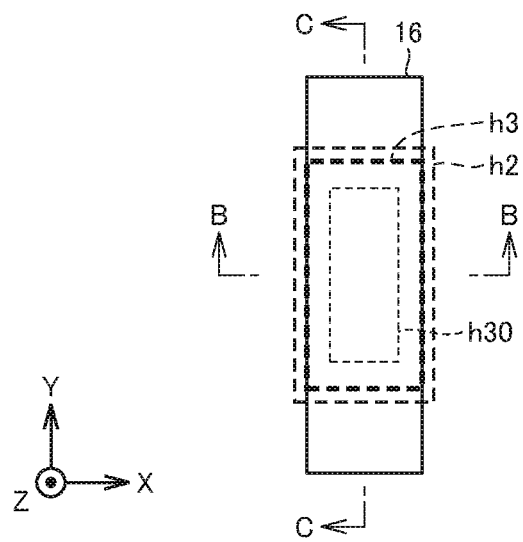
FIG. 6A is a schematic plan view illustrating openings of a fourth insulating film and an opening of a third insulating film in a second embodiment.
Figure 6B:
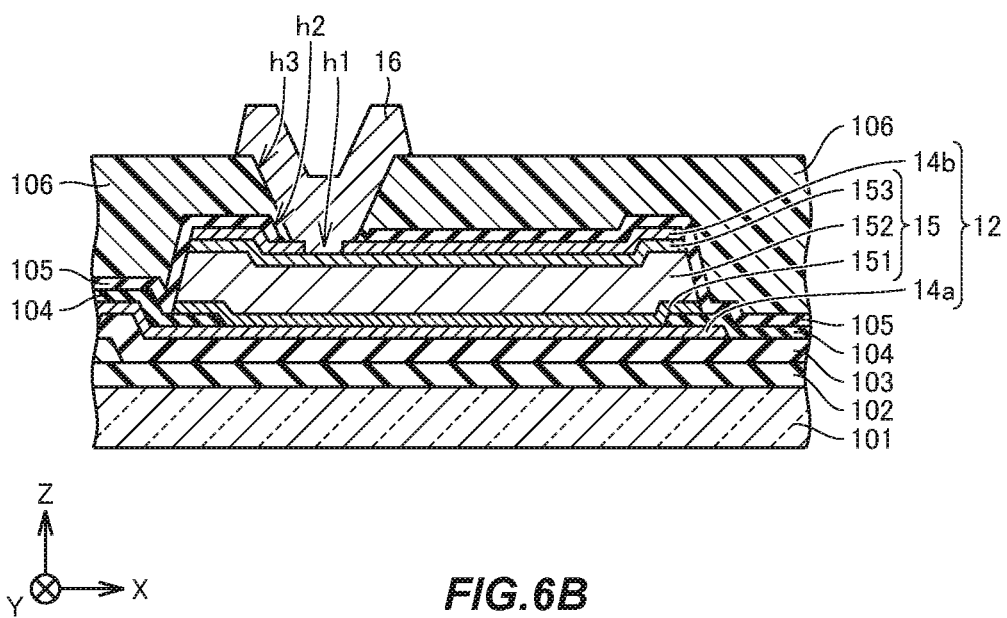
FIG. 6B is a schematic cross-sectional view taken along line B-B in FIG. 6A.
Figure 6C:
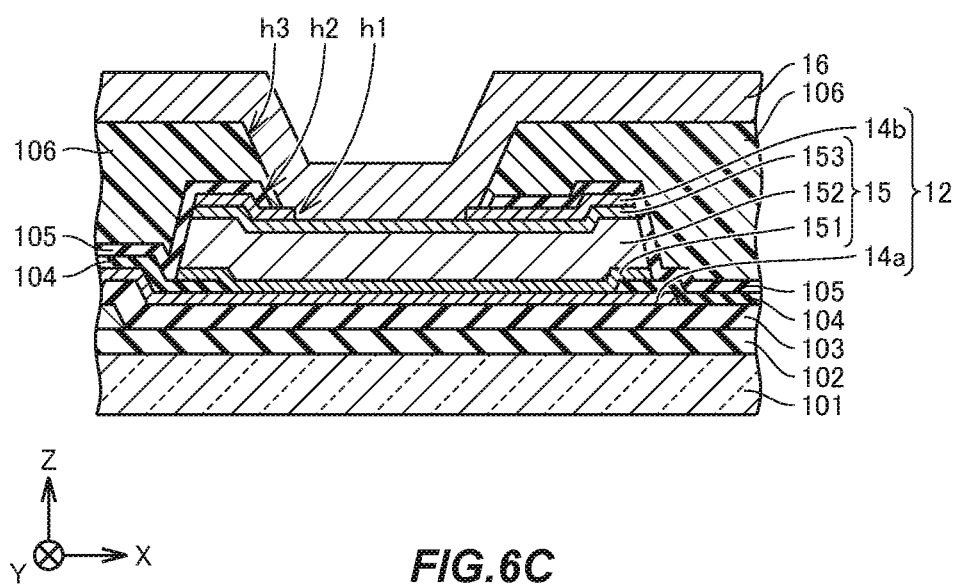
FIG. 6C is a schematic cross-sectional view taken along line C-C in FIG. 6A.

FIG. 6A is a plan view schematically showing an opening h2 of a third insulating film 105, openings h30 and h3 of a fourth insulating film 106 before and after an ashing process, and a portion of a bias line 16 in the present embodiment. FIG. 6B is a schematic cross-sectional view taken along line B-B in FIG. 6A, and FIG. 6C is a schematic cross-sectional view taken along line C-C in FIG. 6A. FIGS. 6B and 6C both show the state after the fourth insulating film 106 has been subjected to an ashing process. For the sake of convenience of illustration, a fifth insulating film 107 and a sixth insulating film 108 are not shown in these drawings.

As shown in FIG. 6A, the openings h2, h30, and h3 indicated with dashed lines have rectangular shapes with their long sides extending substantially parallel to the extending direction of the bias line 16 when viewed in plan view. When the opening h2 and the opening h30 are formed in such rectangular shapes, the opening h3 is formed inside the opening h2 more easily at least in the extending direction of the bias line 16 as compared with the case where they have square shapes. In this case, as shown in FIGS. 6B and 6C, in a contact hole CH2 after the ashing process, both end portions of the third insulating film 105 are covered with the fourth insulating film 106, and the bias line 16 and the upper electrode 14b are in contact with each other.

Figure 7A:
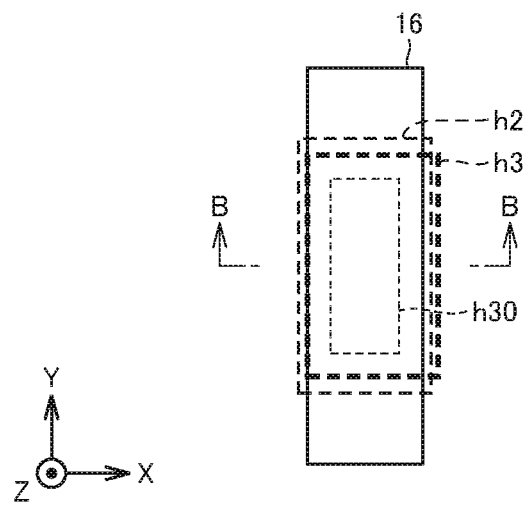
FIG. 7A is a plan view illustrating an example where the position of the opening of the fourth insulating film is different from that in FIG. 6A.

Although FIG. 6A illustrates an example where the opening h3 formed after the ashing process is entirely inside the opening h2, the opening h3 need only be formed such that at least one long side thereof is inside the opening h2 as shown in FIG. 7A. In other words, the opening h3 may be formed such that one of the long sides thereof is located outside the opening h2.

Figure 7B:
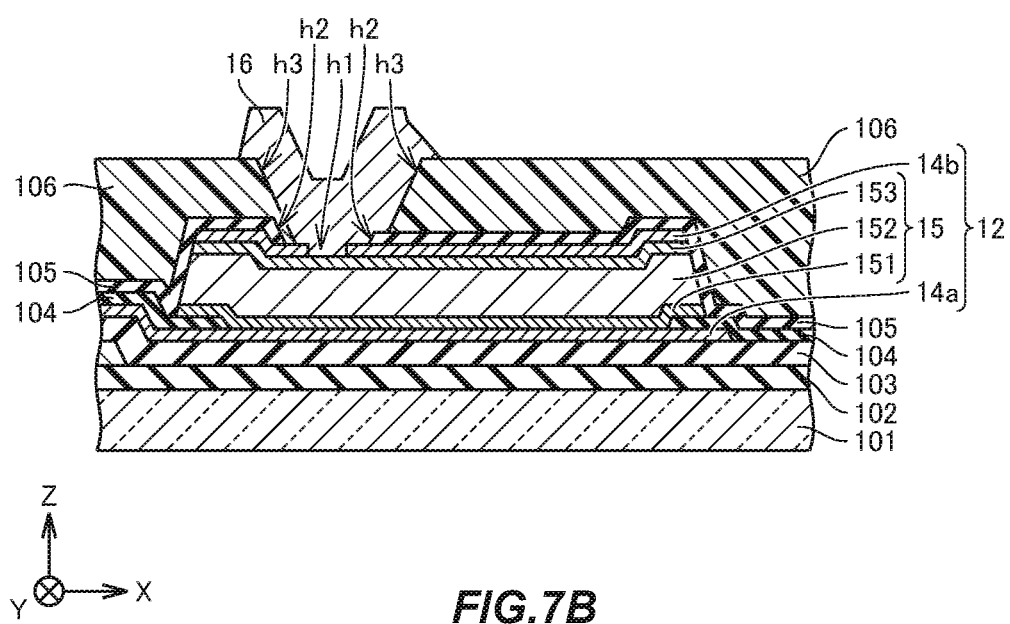
FIG. 7B is a schematic cross-sectional view taken along line B-B in FIG. 7A.

The schematic cross-sectional view taken along line B-B in FIG. 7A is as shown in FIG. 7B. In FIG. 7B, the fifth insulating film 107 and the sixth insulating film 108 are not shown for the sake of convenience of illustration. In this case, as shown in FIG. 7B, in the contact hole CH2, one end portion (on the negative side along the X-axis direction) of the third insulating film 105 is covered with the fourth insulating film 106, whereas the other end portion (on the positive side along the X-axis direction) is not covered with the fourth insulating film 106. However, even with such a configuration, the bias line 16 and the upper electrode 14b are in contact with each other in the contact hole CH2, and accordingly, contact failure between the bias line 16 and the upper electrode 14b is less likely to occur.

FIG. 7A illustrates an example where one of the long sides of the opening h3 is located outside the opening h2. However, for example, as shown in FIG. 7C, the two long sides of the opening h3 may be located inside the opening h2 and one of the short sides of the opening h3 may be located outside the opening h2.

Figure 7C:
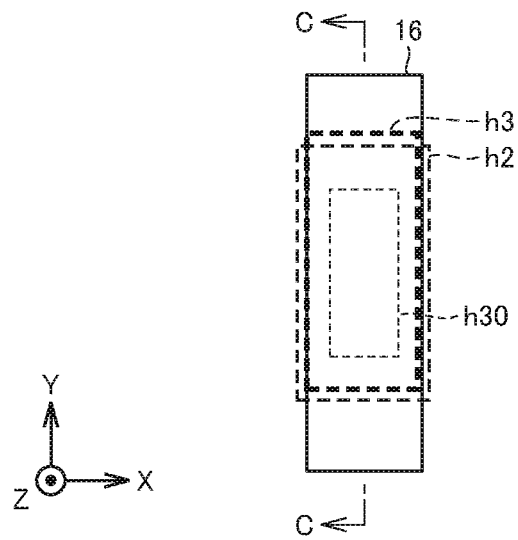
FIG. 7C is a plan view illustrating an example where the position of the opening of the fourth insulating film is different from that in FIG. 7A.
Figure 7D:
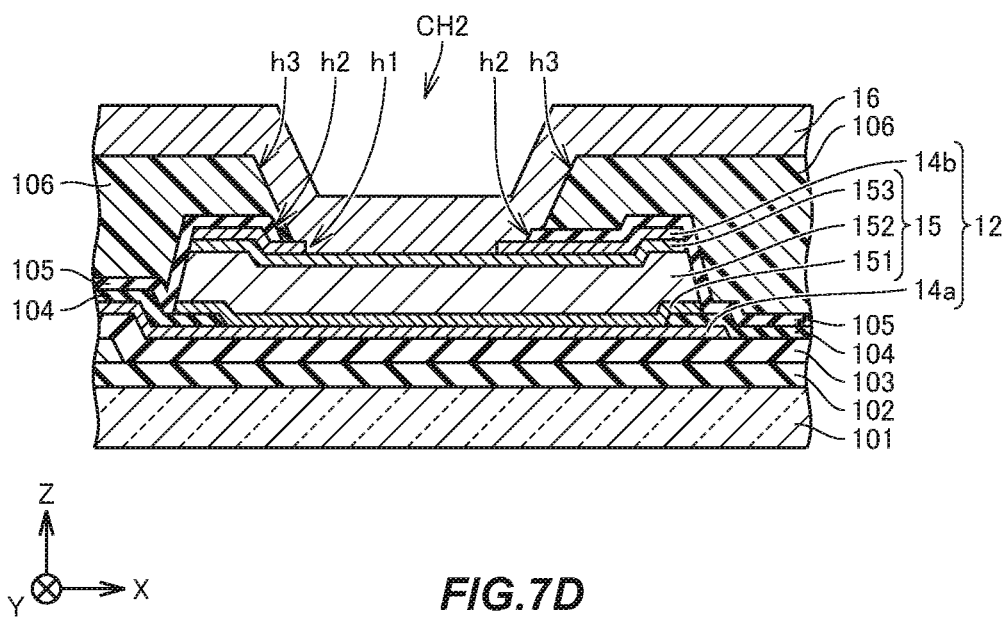
FIG. 7D is a schematic cross-sectional view taken along line C-C in FIG. 7C.

The schematic cross-sectional view taken along line C-C in FIG. 7C is as shown in FIG. 7D. In FIG. 7D, the fifth insulating film 107 and the sixth insulating film 108 are not shown for the sake of convenience of illustration. In this case, as shown in FIG. 7D, in the contact hole CH2, one end portion (on the negative side along the Y-axis direction) of the third insulating film 105 is covered with the fourth insulating film 106, whereas the other end portion (on the positive side along the Y-axis direction) is not covered with the fourth insulating film 106. However, even with such a configuration, contact failure between the contact between the bias line 16 and the upper electrode 14b is prevented from occurring.

In the example described above, as shown in FIGS. 7B and 7D, in the contact hole CH2, the end portions of the upper electrode 14b protrude farther than the end portions of the third insulating film 105 and the fourth insulating film 106. In this case, the bias line 16 is formed easily so as to extend over the entire interior of the contact hole CH2, whereby disconnection of the bias line 16 inside the contact hole CH2 is prevented.

Figure 8A:
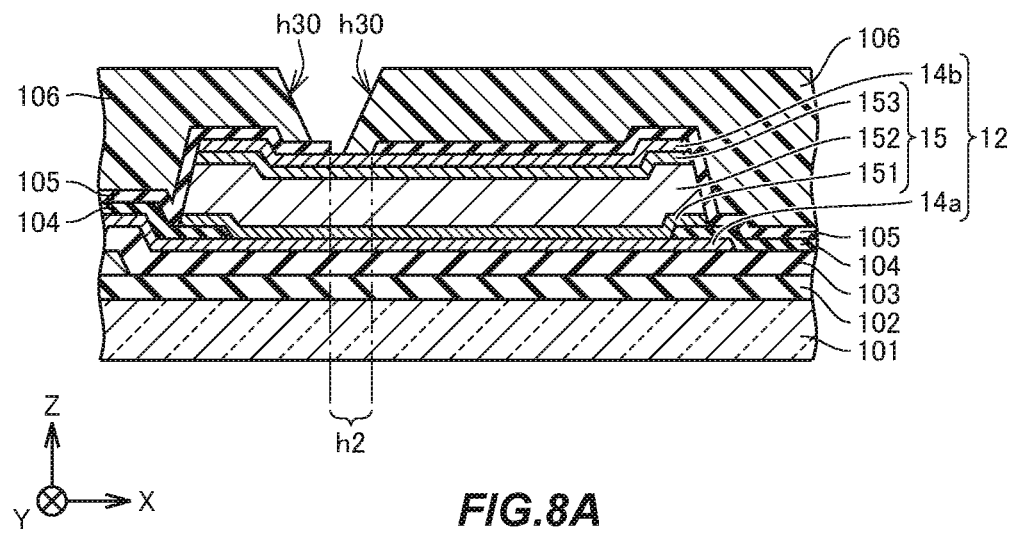
FIG. 8A is a schematic cross-sectional view showing an example where the position of the opening of the fourth insulating film is different from those in FIGS. 7A and 7C.
Figure 8B:
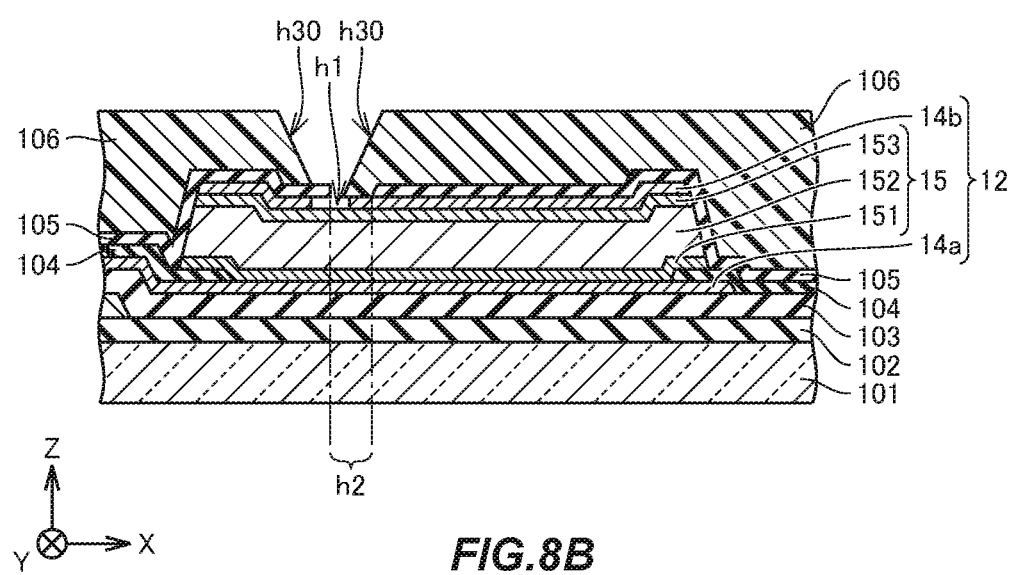
FIG. 8B is a schematic cross-sectional view showing a state where an opening of an upper electrode has been formed using the fourth insulating film shown in FIG. 8A as a mask.

However, at the time of forming the opening h30 of the fourth insulating film 106 prior to the ashing process (see FIG. 5C), the position of the opening h30 may be displaced in the X-axis direction. In this case, as shown in FIG. 8A, one end portion (on the negative side along the X-axis direction) of the third insulating film 105 in the opening h2 protrudes farther than that of the fourth insulating film 106. When the upper electrode 14b is subjected to wet etching in this state using the fourth insulating film 106 as a mask, although an opening h1 of the upper electrode 14b is formed as shown in FIG. 8B, one end portion (on the negative side along the X-axis direction) of the third insulating film 105 in the opening h30 protrudes farther than one end portion (on the negative side along the X-axis direction) of the upper electrode 14b in the opening h1.

Figure 8C:
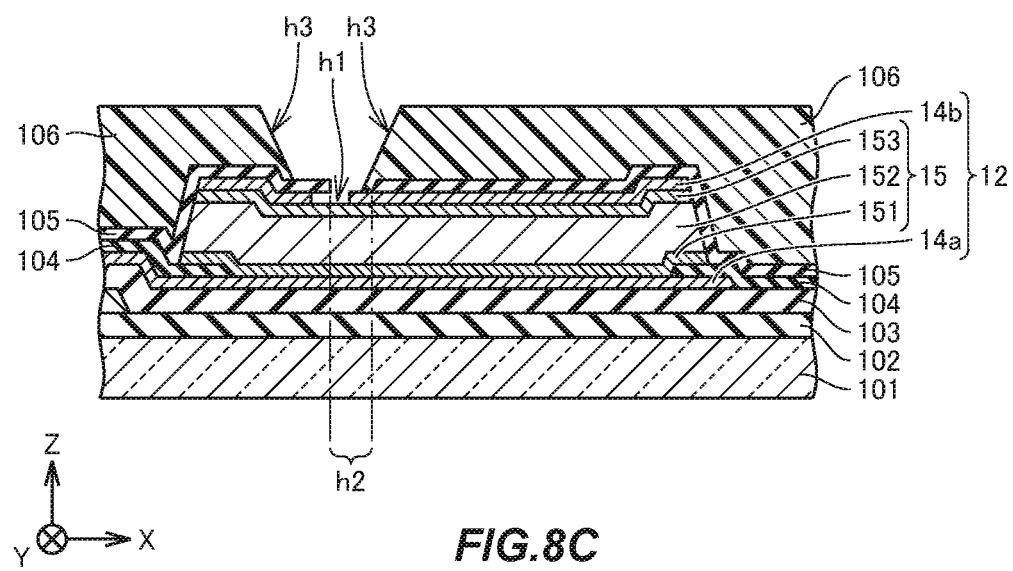
FIG. 8C is a schematic cross-sectional view showing the state where the opening of the fourth insulating film has been expanded through an ashing process of the fourth insulating film shown in FIG. 8B.
Figure 8D:
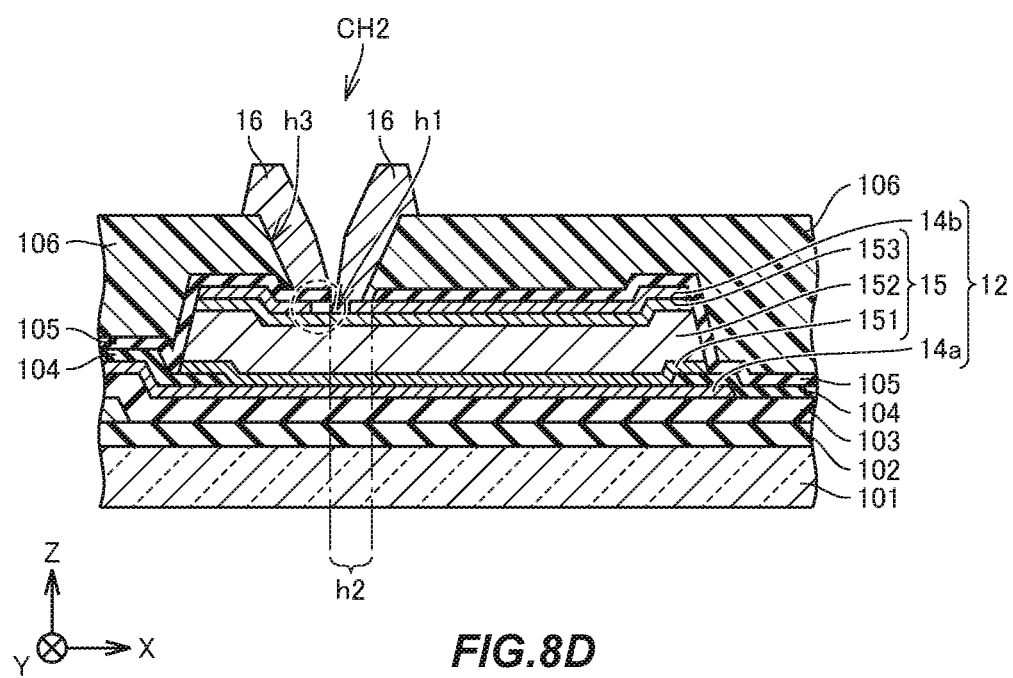
FIG. 8D is a schematic cross-sectional view showing a state where a bias line has been formed on the fourth insulating film shown in FIG. 8C.

Thereafter, by subjecting the fourth insulating film 106 to a plasma ashing process, the opening h30 of the fourth insulating film 106 is expanded to form the opening h3 as shown in FIG. 8C. Then, by performing the same step as that shown in FIG. 5F in the above-described first embodiment, the bias line 16 is formed in the contact hole CH2 as shown in FIG. 8D. In this case, the bias line 16 is not formed in a portion encircled with the dashed line in FIG. 8D, i.e., a region covered with a portion of the third insulating film 105 protruding farther than the upper electrode 14b in the contact hole CH2. Accordingly, the contact hole CH2 includes a portion where the bias line 16 is not in contact with the upper electrode 14b. However, in the contact hole CH2, the other end portion (on the positive side along the X-axis direction) of the upper electrode 14b is in contact with the bias line 16 without being covered with the other end portion (on the positive side along the X-axis direction) of the third insulating film 105. Accordingly, in this case, although the area of a portion where the bias line 16 and the upper electrode 14b are in contact with each other is smaller than those in FIGS. 7B and 7D, contact failure between the bias line 16 and the upper electrode 14b is less likely to occur.

Figure 8E:
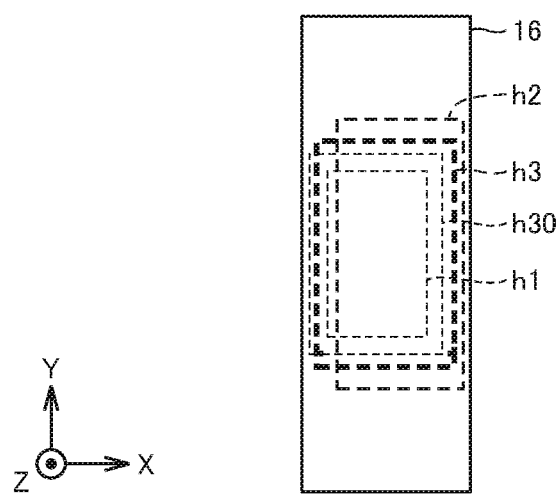
FIG. 8E is a schematic plan view for illustrating the positional relationship of the openings shown in FIG. 8D.

When the openings h2, h30, and h3 have rectangular shapes with their longitudinal directions coincide with the extending direction of the bias line 16, even if the positions of the openings h30 and h3 are displaced toward the negative side along the X-axis direction relative to the opening h2, contact failure between the bias line 16 and the upper electrode 14b is less likely to occur in the extending direction of the bias line 16. Specifically, even when the positional relationship of the openings h1, h2, h30, and h3 is as shown in FIG. 8E, contact failure is less likely to occur. As shown in FIG. 8E, the long sides of the openings h30 and h2 on the negative side along the X-axis direction are located outside the opening h2, whereas the long sides of the openings h30 and h3 on the positive side along the X-axis direction are located inside the opening h2. With this configuration, in the extending direction of the bias line 16, end portions of the upper electrode 14b in the opening h1 are not covered with the third insulating film 105 and the fourth insulating film 106, and accordingly, contact failure between the bias line 16 and the upper electrode 14b is less likely to occur.

Third Embodiment

Although the first and second embodiments described above are directed to the configurations in which the bias line 16 is in direct contact with the upper electrode 14b, the bias line 16 need not be in direct contact with the upper electrode 14b as long as the bias line 16 and the upper electrode 14b are electrically connected to each other. In the following, another configuration for connecting the upper electrode 14b and the bias line 16 will be described.

Figure 9A:
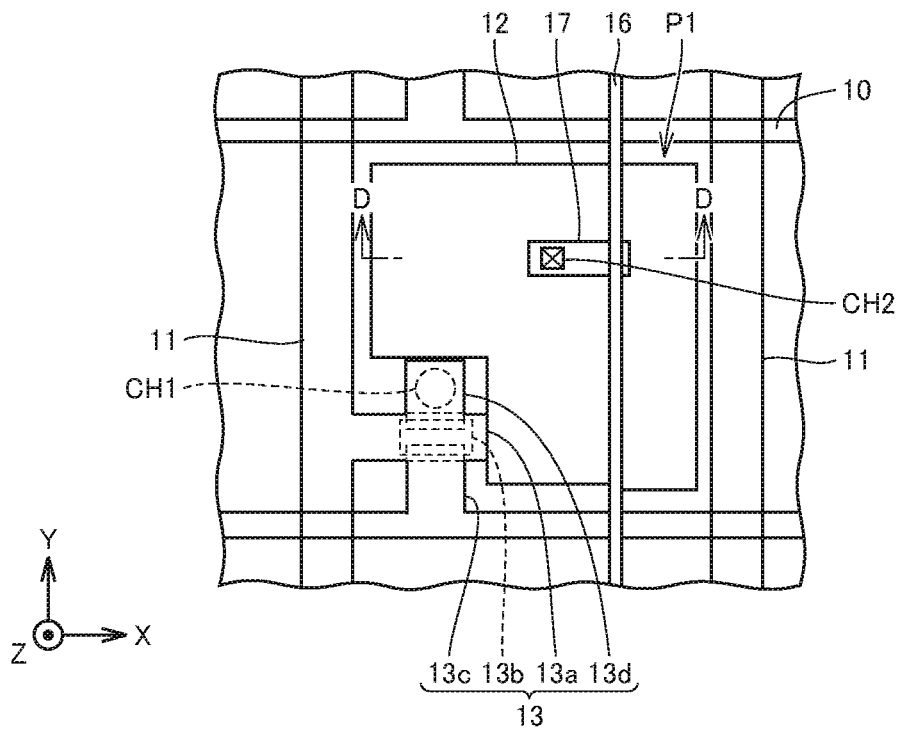
FIG. 9A is an enlarged plan view showing one of pixels on an active matrix substrate of a third embodiment.
Figure 9B:
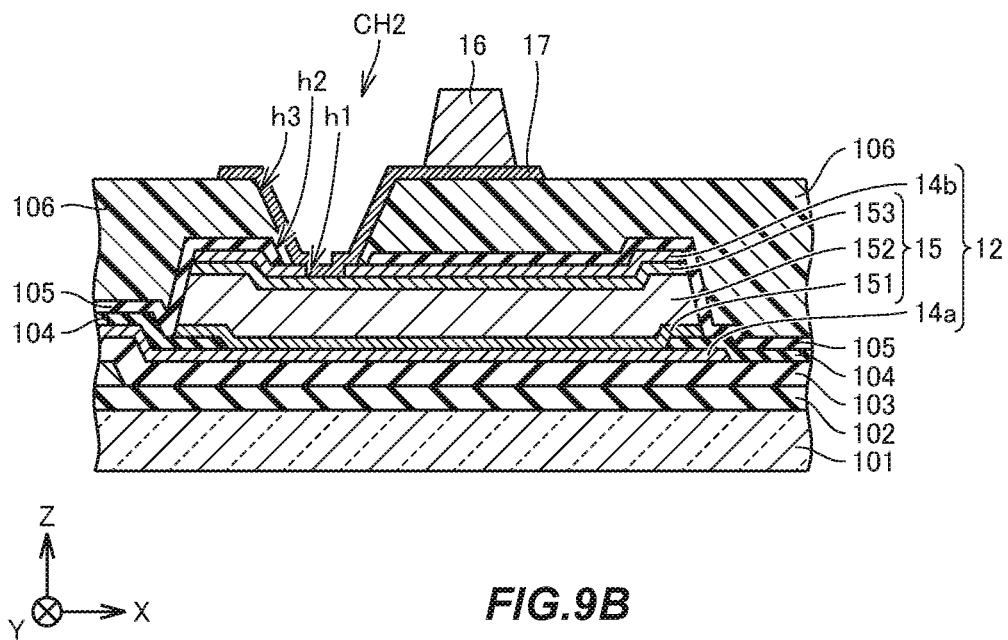
FIG. 9B is a schematic cross-sectional view taken along line D-D in FIG. 9A.

FIG. 9A is a plan view showing a schematic configuration of a pixel P1 in the present embodiment. FIG. 9B is a schematic cross-sectional view taken along line D-D in FIG. 9A and showing the structure of a portion of the pixel P1. In FIGS. 9A and 9B, the same components as those in the first embodiment are given the same reference numerals as used in the first embodiment. In the following, differences from the configuration of the first embodiment will be described.

As shown in FIGS. 9A and 9B, a transparent conductive film 17 is provided extending over the interior of a contact hole CH2 and on a fourth insulating film 106 so as to be in contact with an upper electrode 14b and a p-type amorphous semiconductor layer 153. The transparent conductive film 17 is made of ITO or IZO, for example.

Although not shown in FIG. 9B, a fifth insulating film 107 is provided so as to cover the surface of the transparent conductive film 17 and the surface of a bias line 16 (see FIG. 4A), and a sixth insulating film 108 is formed so as to cover the fifth insulating film 107 (see FIG. 4A).

The bias line 16 is provided on the transparent conductive film 17 on the outside of a contact hole CH2, and is electrically connected to the upper electrode 14b and the p-type amorphous semiconductor layer 153 via the transparent conductive film 17.

In this example, the bias line 16 is formed by laminating metal films made of titanium (Ti), aluminum (Al), and titanium (Ti), respectively. In the case where the bias line 16 is in direct contact with the upper electrode 14b as in the first embodiment, when there is a portion where the upper electrode 14b and the p-type amorphous semiconductor layer 153 are not covered with the lowermost layer made of titanium (Ti), the intermediate layer made of aluminum (Al) is in direct contact with the upper electrode 14b and the p-type amorphous semiconductor layer 153. In this case, the bias line 16 may be disconnected owing to local electric corrosion of the bias line 16, and characteristic defects of a photodiode 12 may be caused by diffusion of aluminum (Al) into silicon (Si) in a photoelectric conversion layer 15.

In the present embodiment, the transparent conductive film 17 is in contact with the upper electrode 14b and the p-type amorphous semiconductor layer 153, and the bias line 16 is not in direct contact with the upper electrode 14b and the p-type amorphous semiconductor layer 153. Accordingly, as compared with the configuration of the first embodiment, disconnection of the bias line 16 and the characteristic defects of the photodiode 12 are prevented more effectively, whereby a reduction in yield of the active matrix substrate 1 can be suppressed.

Although the embodiments of the present invention have been described above, the above-described embodiments are merely illustrative examples of possible implementations. Therefore, the present invention is not limited to the above-described embodiments, and the above-described embodiments may be modified as appropriate without departing from the spirit and the scope of the present invention.

(1) In each of the above-described embodiments, an X-ray imaging panel can be produced by forming a scintillator 4 on the active matrix substrate 1 so as to cover the imaging region of the active matrix substrate 1.

(2) In each of the above-described embodiments, the third insulating film 105, which is an inorganic insulating film, is provided so as to cover the photodiode 12, and the fourth insulating film 106, which is an organic insulating film, is provided on the third insulating film 105. It is to be noted, however, that the organic insulating film need only be provided as a layer positioned above at least the photodiode 12.

(3) Each of the above-described embodiments describes an example where the opening h30 of the fourth insulating film 106 is formed, the upper electrode 14b is then formed, and thereafter, the opening h30 is expanded through a plasma ashing process. However, the step of expanding the opening h30 may be omitted in the following cases. The step of expanding the opening h30 may be omitted in the case where, in the above-described step shown in FIG. 5D, the width W1 of the opening h1 of the upper electrode 14b is substantially the same as or smaller than the width W30 of the opening h30. In this case, the end portions of the upper electrode 14b in the opening h1 are not covered with the fourth insulating film 106, and accordingly, contact failure between the bias line 16 to be formed thereafter and the upper electrode 14b is less likely to occur.

The above-described active matrix substrate can be described as follows.

The active matrix substrate is an active matrix substrate including: a photoelectric conversion element; an electrode provided with a first opening, the electrode being disposed on one surface of the photoelectric conversion element; an organic insulating film provided with a second opening, the organic insulating film covering the photoelectric conversion element and the electrode; and a conductive film for supplying a bias voltage to the electrode, wherein the first opening and the second opening overlap each other when viewed in plan view, and the conductive film is provided inside the first opening and the second opening so as to be in contact with the electrode (first configuration).

According to the first configuration, the electrode disposed on one surface of the photoelectric conversion element has the first opening and the organic insulating film covering the electrode has the second opening. The first opening and the second opening overlap each other when viewed in plan view, and the conductive film for supplying a bias voltage is provided inside these openings so as to be in contact with the electrode. The first opening is formed in a portion where the conductive film and the electrode are in contact with each other. With this configuration, even if components contained in the electrode and the organic insulating film are deposited on the electrode during the production process of the active matrix substrate, such deposits are less likely to remain in the portion where the conductive film and the electrode are in contact with each other. Accordingly, contact failure between the conductive film and the electrode owing to the presence of the deposits is prevented, whereby a reduction in yield of the active matrix substrate can be suppressed.

In the first configuration, the electrode may be a transparent conductive film that contains indium, at least one of zinc and tin, and oxygen. (second configuration).

In the first or second configuration, the conductive film may be a bias line that is made of a metal material and extends in one direction on the photoelectric conversion element (third configuration).

In the third configuration, the active matrix substrate may be configured such that it further includes an inorganic insulating film provided with a third opening, the inorganic insulating film covering a surface of the electrode and a surface of the photoelectric conversion element, wherein the organic insulating film covers a surface of the inorganic insulating film, and the second opening is formed farther inward than the third opening, and the first opening is formed farther inward than the second opening (fourth configuration).

According to the fourth configuration, the surface of the electrode and the surface of the photoelectric conversion element are covered with the inorganic insulating film. With this configuration, even if moisture has entered the active matrix substrate, the moisture is less likely to penetrate into the surface of the photoelectric conversion element. Furthermore, out of the first opening, second opening, and third opening, the first opening is located on the innermost side. Accordingly, end portions of the electrode in the first opening are not covered with the organic insulating film or the inorganic insulating film, whereby contact failure between the bias line and the electrode is less likely to occur.

In the third configuration, the active matrix substrate may be configured such that it further includes an inorganic insulating film provided with a third opening, the inorganic insulating film covering a surface of the electrode and a surface of the photoelectric conversion element, wherein the organic insulating film covers a surface of the inorganic insulating film, and the second opening and the third opening have rectangular shapes with their long sides extending substantially parallel to an extending direction of the bias line when viewed in plan view (fifth configuration).

According to the fifth configuration, the surface of the electrode and the surface of the photoelectric conversion element are covered with the inorganic insulating film. With this configuration, even if moisture has entered the active matrix substrate, the moisture is less likely to penetrate into the surface of the photoelectric conversion element. Furthermore, the second opening and the third opening have rectangular shapes with their longitudinal direction coincide with the extending direction of the bias line when viewed in plan view. Accordingly, during the production process of the active matrix substrate, disconnection of the bias line owing to the misalignment between the second opening and the third opening in the extending direction of the bias line is less likely to occur.

In the first or second configuration, the conductive film may be made of a transparent conductive material, and the active matrix substrate may further include a bias line that is connected to the conductive film and to which the bias voltage is suppled (sixth configuration).

According to the sixth configuration, a bias voltage is supplied to the electrode from the bias line through the conductive film made of the transparent conductive material. When the bias line has a laminate structure in which a plurality of metal layers are laminated, the bias line may contain a metal that causes electric corrosion and the like when the metal is brought into direct contact with the electrode. With this configuration, the bias line and the electrode are not in direct contact with each other. Accordingly, even if such a metal is contained in the bias line, electric corrosion and the like are less likely to occur.

The above-described X-ray imaging panel may include an active matrix substrate with any of the first to sixth configurations and a scintillator for converting X-rays incident thereon to scintillation light (seventh configuration).

According to the seventh configuration, contact failure between the conductive film and the electrode is less likely to occur, and results of imaging by irradiation with X-rays can be obtained properly.

A method for producing the above-described active matrix substrate can be described as follows.

A method for producing an active matrix substrate is a method including: forming a photoelectric conversion element on a substrate; forming an electrode on one surface of the photoelectric conversion element; forming an organic insulating film that covers the photoelectric conversion element and the electrode and forming an opening of the organic insulating film at a position where the opening overlaps the electrode when viewed in plan view; forming, after the opening of the organic insulating film has been formed, an opening of the electrode at a position where the opening of the electrode overlaps the opening of the organic insulating film when viewed in plan view; and forming a conductive film inside the opening of the electrode and the opening of the organic insulating film so as to be in contact with the electrode (first method).

According to the first method, the opening of the electrode provided on one surface of the photoelectric conversion element and the opening of the organic insulating film covering the electrode overlap each other when viewed in plan view. The conductive film for supplying a bias voltage to the electrode is provided inside these openings so as to be in contact with the electrode. After the electrode has been formed, even if components contained in the electrode and the organic insulating film are deposited on the electrode in the step of forming the opening of the organic insulating film, the opening of the electrode is formed in a portion where the conductive film and the electrode are in contact with each other after the opening of the organic insulating film has been formed. Accordingly, the deposits are less likely to remain in the portion where the conductive film and the electrode are in contact with each other, and contact failure between the conductive film and the electrode owing to the presence of the deposits is less likely to occur. As a result, a reduction in yield of the active matrix substrate can be suppressed.

The first method may be configured such that it further includes, after the opening of the electrode has been formed, expanding the opening of the organic insulating film such that the opening of the organic insulating film is disposed farther outward than the opening of the electrode when viewed in plan view, and the opening of the electrode is formed using the organic insulating film as a mask (second method).

According to the second method, the opening of the electrode is formed using the organic insulating film as a mask. It is thus not necessary to provide a photomask for forming the opening of the electrode separately, whereby the number of steps required for producing the active matrix substrate can be reduced. Furthermore, as a result of expanding the opening of the organic insulating film, the opening of the electrode is located inside the opening of the organic insulating film. Accordingly, unlike the case where the opening of the organic insulating film is located inside the opening of the electrode, the end portions of the organic insulating film in the opening do not protrude farther than the end portions of the electrode. With this configuration, contact between the conductive film and the electrode can be established more reliably.

The first or second method may be configured such that it further includes, after the electrode has been formed, forming an inorganic insulating film that covers a surface of the electrode and a surface of the photoelectric conversion element and forming an opening of the inorganic insulating film at a position where the opening overlap the photoelectric conversion element when viewed in plan view, the opening of the inorganic insulating film overlaps the opening of the organic insulating film and the opening of the electrode when viewed in plan view, and the conductive film is formed inside the opening of the inorganic insulating film, the opening of the organic insulating film, and the opening of the electrode (third method).

According to the third method, the surface of the electrode and the surface of the photoelectric conversion element are covered with the inorganic insulating film. Thus, as compared with the case where they are not covered with the inorganic insulating film, even when moisture has entered the active matrix substrate, the moisture is less likely to penetrate into the surface of the photoelectric conversion element. Furthermore, since the conductive film is formed inside the opening of the inorganic insulating film, the opening of the organic insulating film, and the opening of the electrode, the conductive film can be brought into contact with the electrode.

LIST OF REFERENCE NUMERALS

1: Active matrix substrate
2: Control unit
2A: Gate control section
2B: Signal readout section
3: X-ray source
4: Scintillator
10: Source line
11: Gate line
12: Photodiode
13: Thin film transistor (TFT)
13a: Gate electrode
13b: Semiconductor active layer
13c: Source electrode
13d: Drain electrode
14a: Lower electrode
14b: Upper electrode
15: Photoelectric conversion layer
16: Bias line
100: X-ray imaging device
101: Substrate
102: Gate insulating film
103: First insulating film
104: Second insulating film
105: Third insulating film
106: Fourth insulating film
107: Fifth insulating film
108: Sixth insulating film
151: n-type amorphous semiconductor layer
152: Intrinsic amorphous semiconductor layer
153: p-type amorphous semiconductor layer

What is claimed is:

1. An active matrix substrate comprising:
a photoelectric conversion element;
an electrode provided with a first opening, the electrode being disposed on one surface of the photoelectric conversion element;
an organic insulating film provided with a second opening, the organic insulating film covering the photoelectric conversion element and the electrode; and
a conductive film for supplying a bias voltage to the electrode,
wherein the first opening and the second opening overlap each other when viewed in plan view, and
the conductive film is provided inside the first opening and the second opening so as to be in contact with the electrode.

2. The active matrix substrate according to claim 1, wherein the electrode is a transparent conductive film that contains indium, at least one of zinc and tin, and oxygen.

3. The active matrix substrate according to claim 1, wherein the conductive film is a bias line that is made of a metal material and extends in one direction on the photoelectric conversion element.

4. The active matrix substrate according to claim 3, further comprising an inorganic insulating film provided with a third opening, the inorganic insulating film covering a surface of the electrode and a surface of the photoelectric conversion element, wherein the organic insulating film covers a surface of the inorganic insulating film, and the second opening is formed farther inward than the third opening, and the first opening is formed farther inward than the second opening.

5. The active matrix substrate according to claim 3, further comprising an inorganic insulating film provided with a third opening, the inorganic insulating film covering a surface of the electrode and a surface of the photoelectric conversion element, wherein the organic insulating film covers a surface of the inorganic insulating film, and the second opening and the third opening have rectangular shapes with their long sides extending substantially parallel to an extending direction of the bias line when viewed in plan view.

6. The active matrix substrate according to claim 1, wherein the conductive film is made of a transparent conductive material, and the active matrix substrate further includes a bias line that is connected to the conductive film and to which the bias voltage is suppled.

7. An X-ray imaging panel comprising:

the active matrix substrate according to claim 1; and a scintillator for converting X-rays incident thereon to scintillation light.

8. A method for producing an active matrix substrate, the method comprising:

forming a photoelectric conversion element on a substrate;

forming an electrode on one surface of the photoelectric conversion element;

forming an organic insulating film that covers the photoelectric conversion element and the electrode and forming an opening of the organic insulating film at a position where the opening overlaps the electrode when viewed in plan view;

forming, after the opening of the organic insulating film has been formed, an opening of the electrode at a position where the opening of the electrode overlaps the opening of the organic insulating film when viewed in plan view; and forming a conductive film inside the opening of the electrode and the opening of the organic insulating film so as to be in contact with the electrode.

9. The method according to claim 8, further comprising, after the opening of the electrode has been formed, expanding the opening of the organic insulating film such that the opening of the organic insulating film is disposed farther outward than the opening of the electrode when viewed in plan view, wherein the opening of the electrode is formed using the organic insulating film as a mask.

10. The method according to claim 8, further comprising, after the electrode has been formed, forming an inorganic insulating film that covers a surface of the electrode and a surface of the photoelectric conversion element and forming an opening of the inorganic insulating film at a position where the opening overlap the photoelectric conversion element when viewed in plan view, wherein the opening of the inorganic insulating film overlaps the opening of the organic insulating film and the opening of the electrode when viewed in plan view, and the conductive film is formed inside the opening of the inorganic insulating film, the opening of the organic insulating film, and the opening of the electrode.

* * * * *